(12) United States Patent  
Yoo

(10) Patent No.: US 10,804,294 B2  
(45) Date of Patent: Oct. 13, 2020

(54) FERROELECTRIC DEVICE AND METHOD OF MANUFACTURING THE SAME

(71) Applicant: SK hynix Inc., Icheon (KR)

(72) Inventor: Hyangkeun Yoo, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/168,687

(22) Filed: Oct. 23, 2018

(65) Prior Publication Data

US 2019/0244973 A1 Aug. 8, 2019

(30) Foreign Application Priority Data

Feb. 8, 2018 (KR) .................. 10-2018-0015858

(51) Int. Cl.

| | |
|---|---|
| H01L 21/02 | (2006.01) |
| H01L 27/11585 | (2017.01) |
| G11C 11/22 | (2006.01) |
| H01L 29/51 | (2006.01) |
| H01L 21/28 | (2006.01) |
| H01L 21/22 | (2006.01) |

(52) U.S. Cl.

CPC ...... *H01L 27/11585* (2013.01); *G11C 11/223* (2013.01); *G11C 11/2273* (2013.01); *G11C 11/2275* (2013.01); *H01L 21/022* (2013.01); *H01L 21/02178* (2013.01); *H01L 21/02181* (2013.01); *H01L 21/02189* (2013.01); *H01L 21/02304* (2013.01); *H01L 21/02356* (2013.01); *H01L 21/22* (2013.01); *H01L 21/28291* (2013.01); *H01L 29/40111* (2019.08); *H01L 29/516* (2013.01)

(58) Field of Classification Search

CPC combination set(s) only.  
See application file for complete search history.

(56) References Cited

U.S. PATENT DOCUMENTS

| 6,929,956 B2 | 8/2005 | Kim et al. | |
|---|---|---|---|
| 8,304,823 B2 | 11/2012 | Boescke | |
| 2007/0148919 A1* | 6/2007 | Lin .................... | H01L 21/02381 438/478 |
| 2008/0079048 A1* | 4/2008 | Kim .................. | H01L 27/10876 257/300 |
| 2009/0261395 A1* | 10/2009 | Boescke ........... | H01L 21/02181 257/295 |
| 2016/0308021 A1* | 10/2016 | Lee ..................... | H01L 29/1054 |
| 2017/0103988 A1 | 4/2017 | Nishida et al. | |
| 2017/0162250 A1 | 6/2017 | Slesazeck et al. | |
| 2017/0345831 A1* | 11/2017 | Chavan ............. | H01L 29/40111 |
| 2019/0096767 A1* | 3/2019 | Yeh .................... | H01L 21/02181 |

* cited by examiner

*Primary Examiner* — Moin M Rahman

(57) ABSTRACT

In a method of manufacturing a ferroelectric device, a substrate is provided. A ferroelectric material film is formed over the substrate. A crystallization seed film is formed over the ferroelectric material film. The ferroelectric material film is heat-treated to covert the ferroelectric material film into a crystalline ferroelectric film. The crystallization seed film is removed to expose the crystalline ferroelectric film. An electrode film is formed over the ferroelectric film.

10 Claims, 28 Drawing Sheets

FERROELECTRIC DEVICE AND METHOD OF MANUFACTURING THE SAME

CROSS-REFERENCE TO RELATED APPLICATION

The present application claims priority under 35 U.S.C 119(a) to Korean Patent Application No. 10-2018-0015858, filed on Feb. 8, 2018, which is incorporated by reference herein in its entirety.

BACKGROUND

1. Technical Field

Various embodiments of the present disclosure generally relate to a semiconductor device, and more particularly, relate to a ferroelectric memory device and a method of manufacturing the same.

2. Related Art

Generally, a ferroelectric material has spontaneous electrical polarization when no external electric field is applied to the ferroelectric material. In addition, the ferroelectric material can be controlled to maintain one of two stable polarization states on a ferroelectricity hysteresis curve. Such a characteristic can be utilized in memory devices to store logic information of "0" or "1" in a nonvolatile manner.

Recently, a field effect transistor type ferroelectric memory device, in which a ferroelectric material is applied to a gate dielectric layer, has been introduced. A write operation of the field effect transistor type ferroelectric memory device may be performed by supplying a predetermined write voltage to a gate electrode layer and writing different polarization states in the gate dielectric layer as logic information. A read operation of the ferroelectric memory device may be performed by detecting an operation current passing through a channel of the field effect transistor type ferroelectric memory device using a property that a channel resistance of the field effect transistor type ferroelectric memory device changes depending on a polarization state written in the gate dielectric layer.

SUMMARY

There is provided a method of manufacturing a ferroelectric device according to one aspect of the present disclosure. In the method, a substrate is provided. A ferroelectric material film is formed over the substrate. A crystallization seed film is formed over the ferroelectric material film. The ferroelectric material film is heat-treated using the crystallization seed film to convert the ferroelectric material film into a crystalline ferroelectric film. The crystallization seed film is removed to expose the crystalline ferroelectric film. An electrode film is formed over the crystalline ferroelectric film.

There is provided a method of manufacturing a ferroelectric device according to another aspect of the present disclosure. In the method, a substrate is provided. A crystallization seed film is formed over the substrate. A ferroelectric material film is formed over the crystallization seed film. The ferroelectric material film is heat-treated to convert the ferroelectric material film into a crystalline ferroelectric film. An electrode film is formed on the crystalline ferroelectric film.

There is provided a ferroelectric device according to another aspect of the present disclosure. The ferroelectric device includes a substrate, an interfacial insulating layer disposed over the substrate, a crystallization seed layer disposed over the interfacial insulating layer, a ferroelectric layer disposed over the crystallization seed layer, and a gate electrode layer disposed over the ferroelectric layer. The crystallization seed layer includes a dielectric layer having a dielectric constant that is greater than a dielectric constant of the interfacial insulating layer.

There is provided a ferroelectric device according to another aspect of the present disclosure. The ferroelectric device includes a substrate, a ferroelectric layer disposed over the substrate, and a gate electrode layer disposed over the ferroelectric layer. The ferroelectric layer has a thickness of 3 nm to 15 nm, and an average grain size of the ferroelectric layer is smaller than the thickness of the ferroelectric layer.

DETAILED DESCRIPTION

Figure 1:
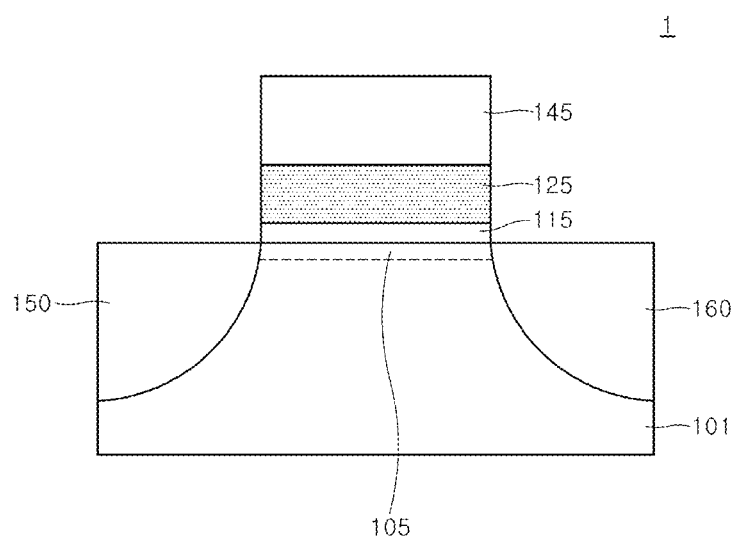
FIG. 1 is a cross-sectional view schematically illustrating a ferroelectric device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or the possibility of addition of one or more other features, numbers, steps, operations, components, parts, or combinations thereof. Further, in performing a method or a manufacturing method, each process constituting the method can take place differently from the stipulated order unless a specific sequence is described explicitly in the context. In other words, each process may be performed in the same manner as the stated order, may be performed substantially at the same time, or may be performed in a reverse order.

FIG. 1 is a cross-sectional view schematically illustrating a ferroelectric device 1 according to an embodiment of the present disclosure. Referring to FIG. 1, the ferroelectric device 1 may include a substrate 101, an interfacial insulating layer 115, a ferroelectric layer 125, and a gate electrode layer 145. In an embodiment, the ferroelectric device 1 may be a transistor type memory device in which different channel resistances are implemented depending on a polarization orientation written in the ferroelectric layer 125.

The ferroelectric device 1 described in this embodiment can perform the following memory operations. In a write operation, when a predetermined write voltage is applied to the ferroelectric layer 125 through the gate electrode layer 145, polarization having a predetermined polarization orientation may be written in the ferroelectric layer 125. In addition, even after the write voltage is removed, the polarization having the predetermined polarization orientation may be remanent in the ferroelectric layer 125 to store data information corresponding to the polarization in a nonvolatile manner. The remanent polarization may induce electrons into a channel region 105 of the substrate 101 or may eject the electrons from the channel region 105, according to the predetermined polarization orientation. Alternatively, the remanent polarization may induce holes into the channel region 105 or may eject the holes from the channel region 105, according to the predetermined polarization orientation.

The channel region 105 may be a region located in the substrate 101 under the interfacial insulating layer 115 and may be a region where conductive carriers such as electrons or holes are concentrated.

In a read operation, when a read voltage is applied to the gate electrode layer 145, a channel, which is a path through which the carriers conduct, may be formed in the channel region 105 between a source region 150 and a drain region 160. An electrical resistance of the channel will be referred to as a 'channel resistance.'

In the read operation of the ferroelectric device 1, when the read voltage is applied to the gate electrode layer 145, electric charges may be induced into the channel region 105 by the electrical attraction of the remanent polarization of the ferroelectric layer 125. At this time, the channel resistance between the source region 150 and the drain region 160 may vary depending on a type and an amount of the induced electric charges. For example, in a case of a ferroelectric device having an N-type field effect transistor type, as the density of electrons induced in the channel region 105 increases due to the read voltage having a positive polarity, the channel resistance may decrease. Thus, data information stored in the ferroelectric device 1 can be read by measuring the change in the channel resistance.

The substrate 101 may include a semiconductor material. The substrate 101 may be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. For example, the substrate 101 may be doped with a p-type dopant or an n-type dopant.

The source region 150 and the drain region 160 may be disposed in the substrate 101 at both ends or on opposite sides of the gate electrode layer 145. In an embodiment, the source region 150 and the drain region 160 may be doped to have a conductive type that is opposite to that of the substrate 101. For example, when the substrate 101 is doped with a p-type dopant, the source region 150 and the drain region 160 may be doped with an n-type dopant. On the other hand, when the substrate 101 is doped with an n-type dopant, the source region 150 and the drain region 160 may be doped with a p-type dopant.

The interfacial insulating layer 115 may be disposed on the substrate 101. The interfacial insulating layer 115 may be interposed between the substrate 101 and the ferroelectric layer 125 to suppress diffusion of materials between the substrate 101 and the ferroelectric layer 125 during a manufacturing process. In addition, the interfacial insulating layer 115 can prevent direct contact between the substrate 101 and the ferroelectric layer 125 that have crystal lattices of different sizes, thereby suppressing the generation of crystal defects due to strain at an interface between the substrate 101 and the ferroelectric layer 125. The interfacial insulating layer 115 may have an amorphous structure.

The interfacial insulating layer 115 may include a silicon oxide, a silicon nitride, a silicon oxynitride, or an aluminum oxide. In an embodiment, when the substrate 101 is a silicon (Si) substrate, the interfacial insulating layer 115 may be a silicon oxide layer, a silicon nitride layer, or a silicon oxynitride layer. The interfacial insulating layer 115 may have a thickness of about 1 nm to about 5 nm.

The ferroelectric layer 125 may be disposed on the interfacial insulating layer 115. The ferroelectric layer 125 may include a ferroelectric material capable of implementing remanent polarization therein, even after an external electric field is removed from the ferroelectric device 1. The ferroelectric layer 125 may have a crystalline structure. A grain size of the ferroelectric layer 125 may be controlled to a predetermined value by a manufacturing method to be described later. Thus, ferroelectric characteristics determined based on grain size can be easily secured by controlling the grain size of the ferroelectric layer 125. It is generally known that a coercive electric field or remanent polarization of a ferroelectric material varies depending on the grain size of the ferroelectric material. The smaller the grain size of the ferroelectric material, the lower the coercive electric field and remanent polarization of the ferroelectric material. On the other hand, the larger the grain size of the ferroelectric material, the greater the coercive electric field and remanent polarization of the ferroelectric material. Therefore, a desired coercive electric field and remanent polarization in a ferroelectric device can be secured by controlling the grain size of the ferroelectric material. At this time, the grain size may represent a grain width that is measured in a lateral direction parallel to a top surface of the substrate 101.

Meanwhile, in an embodiment, the remanent polarization may induce electrons into the channel region 105 of the substrate 101 or may eject electrons from the channel region 105, according to the polarization orientation. When the density of the electrons distributed in the channel region 105 is changed by the remanent polarization, the channel resistance between the source region 150 and the drain region 160 may be changed in the read operation. In an embodiment, the ferroelectric layer 125 may have a thickness of about 3 nm to about 15 nm.

In an embodiment, the ferroelectric layer 125 may include a crystalline metal oxide. The ferroelectric layer 125 may include a binary metal oxide. The ferroelectric layer 125 may include a hafnium oxide, a zirconium oxide, or a combination thereof. At this time, the ferroelectric layer 125 may have an orthorhombic crystal structure.

In an embodiment, the ferroelectric layer 125 may include at least one dopant. The dopant may be uniformly distributed in the ferroelectric layer 125. The dopant distributed in the ferroelectric layer 125 may stabilize the ferroelectricity of the ferroelectric layer 125. When the ferroelectric layer 125 includes the hafnium oxide, the zirconium oxide, or the combination thereof, the ferroelectric layer 125 may include a dopant having a valence of 2 to 4. For example, the dopant of the ferroelectric layer 125 may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof.

The gate electrode layer 145 may be disposed on the ferroelectric layer 125. The gate electrode layer 145 may include a conductive material. The gate electrode layer 145 may include titanium (Ti), tantalum (Ta), tungsten (W), titanium nitride (TiN), tantalum nitride (TaN), tungsten nitride (WN), or a combination thereof.

As described above, a ferroelectric device according to an embodiment of the present disclosure may include a ferroelectric layer with a grain size that is controlled to a predetermined value. Thus, ferroelectric characteristics such as remanent polarization and a coercive electric field can be effectively controlled by the grain size of the ferroelectric layer. As a result, the reliability of write and read operations of the ferroelectric device can be improved by the properly controlled ferroelectric characteristics.

Figure 2:
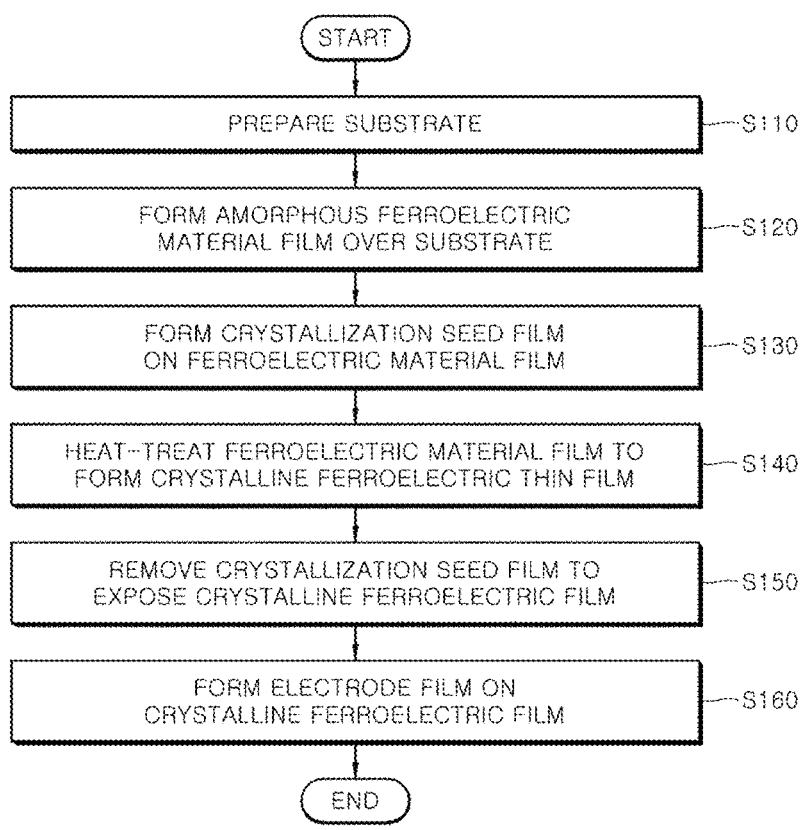
FIG. 2 is a flow chart schematically illustrating a method of manufacturing a ferroelectric device according to an embodiment of the present disclosure.

FIG. 2 is a flow chart schematically illustrating a method of manufacturing a ferroelectric device according to an embodiment of the present disclosure.

At step S110, a substrate may be prepared. The substrate may include a semiconductor material. For example, the substrate may be a p-type doped silicon substrate.

At step S120, an amorphous ferroelectric material film may be formed over the substrate. The ferroelectric material film may include a hafnium oxide, a zirconium oxide, or a combination thereof. The ferroelectric material film may further include a dopant. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof. In an embodiment, the ferroelectric material film may be a hafnium oxide layer doped with silicon (Si). In another embodiment, the ferroelectric material film may be an un-doped hafnium oxide layer. The ferroelectric material film may be formed using a chemical vapor deposition method or an atomic layer deposition method. At this time, the amorphous ferroelectric material film may be formed by controlling process conditions such as a deposition temperature, a deposition pressure, and the like.

At step S130, a crystallization seed film may be formed on the ferroelectric material film. The crystallization seed film may have a crystalline structure. The crystallization seed film may include silicon (Si), germanium (Ge), silicon germanium (SiGe), silicon carbide (SiC), or a combination thereof. The crystallization seed film may be a polycrystalline silicon film. In an embodiment, the crystallization seed film may be formed as follows. First, a crystal grain size of the crystallization seed film and a thickness of the crystallization seed film corresponding to the crystal grain size may be determined. Then, the crystallization seed film having the determined crystal grain size may be deposited to have the determined thickness by controlling a film deposition process. In an embodiment, the crystallization seed film may be formed at a temperature that is lower than a crystallization temperature of the ferroelectric material film.

At step S140, heat-treatment may be performed on the crystallization seed film and the ferroelectric material film to form a crystalline ferroelectric film. In an embodiment, the heat treatment may be performed in a state of the crystallization seed film covering the ferroelectric material film. Accordingly, in the heat treatment process, the crystallization seed film may induce crystallization of the amorphous ferroelectric material film, so that the amorphous ferroelectric material film is converted into the crystalline ferroelectric film. The heat treatment may be performed in a predetermined gas atmosphere including nitrogen ($N_2$), oxygen ($O_2$), hydrogen ($H_2$), argon (Ar), or a combination thereof. The heat-treatment may be performed at a temperature of about 500° C. to about 1000° C.

In an embodiment, a crystal grain size of the crystalline ferroelectric film formed by the heat-treatment may be substantially the same as the crystal grain size of the crystallization seed film. In an embodiment, the crystallization seed film may be formed at step S130 by considering the crystal grain size of the crystalline ferroelectric film, and the crystal grain size of the crystalline ferroelectric film may be determined through the heat-treatment at step S140.

At step S150, the crystallization seed film disposed on the crystalline ferroelectric film may be removed to expose the crystalline ferroelectric film. In an embodiment, the crystallization seed film may be removed using an etching method or a grinding method.

At step S160, an electrode film may be formed on the crystalline ferroelectric film. The electrode film may include titanium (Ti), tantalum (Ta), tungsten (W), titanium nitride (TiN), tantalum nitride (TaN), tungsten nitride (WN), or a combination thereof.

Although not illustrated in FIG. 2, a process of patterning the electrode film and the crystalline ferroelectric film may be additionally performed. As a result, a ferroelectric layer and a gate electrode layer may be formed over the substrate. In addition, a process of selectively implanting a dopant into exposed regions of the substrate may be performed. The exposed regions of the substrate are disposed at both ends or on opposite sides of the gate electrode layer. As a result, a source region and a drain region may be formed in the exposed regions of the substrate.

In some other embodiments, before step S120, an interfacial insulating film may be additionally formed over the substrate, so that the interfacial insulation film is disposed between the substrate and the ferroelectric material film. The interfacial insulating film may include a silicon oxide (e.g., $SiO_2$), a silicon nitride (e.g., $Si_3N_4$), a silicon oxynitride (e.g., SiON), or an aluminum oxide (e.g., $Al_2O_3$). Then, after performing steps S130 to S160, the interfacial insulating film, the crystalline ferroelectric film, and the electrode film sequentially stacked on the substrate may be patterned to form an interfacial insulating layer, the ferroelectric layer, and the gate electrode layer over the substrate.

By performing the above-described processes, the ferroelectric device is manufactured. In some embodiments, the crystallization seed film may have a lattice constant that is different from a lattice constant of the ferroelectric film. For example, when the ferroelectric film includes hafnium oxide ($HfO_2$), the hafnium oxide ($HfO_2$) has a lattice constant of about 5.1 Å. At this time, the crystallization seed film may include silicon carbide (SiC), silicon (Si), germanium (Ge), silicon germanium (SiGe), or a combination thereof. Silicon carbide (SiC) has a lattice constant of about 4.35 Å; silicon (Si) has a lattice constant of about 5.43 Å; germanium (Ge) has a lattice constant of about 5.65 Å; and silicon germanium (SiGe) has a lattice constant that is between the lattice constants of silicon (Si) and germanium (Ge).

In the heat-treatment at step S140, lattice strain may be generated in the ferroelectric film where crystallization proceeds by a difference in the lattice constants of the crystallization seed film and the ferroelectric film. Specifically, the lattice strain may generate a gradient of the lattice strain from an interface between the ferroelectric film and the crystallization seed film into the ferroelectric film. The gradient may generate a flexoelectric effect to form an electric field within the ferroelectric film. As a result, the electric field formed within the ferroelectric film can improve the polarization alignment in the ferroelectric film, thereby stabilizing a ferroelectric characteristic of the ferroelectric film. The ferroelectric characteristic may include a remanent polarization characteristic or a coercive electric field characteristic.

FIGS. 3 to 8 are cross-sectional views schematically illustrating a method of manufacturing a ferroelectric device according to an embodiment of the present disclosure.

Figure 3:
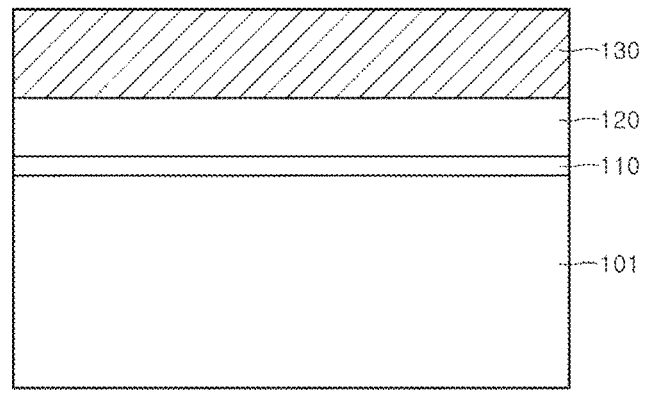
FIGS. 3 to 8 are cross-sectional views schematically illustrating a method of manufacturing a ferroelectric device according to an embodiment of the present disclosure.

Referring to FIG. 3, a substrate 101 may be prepared. The substrate 101 may include a semiconductor material. The substrate 101 may be a silicon (Si) substrate, a gallium arsenide (GaAs) substrate, an indium phosphide (InP) substrate, a germanium (Ge) substrate, or a silicon germanium (SiGe) substrate. In an embodiment, the substrate 101 may be doped to have conductivity. For example, the substrate 101 may be doped with a p-type or n-type dopant. In an embodiment, the substrate 101 may be a p-type doped silicon substrate.

Next, an interfacial insulating film 110 may be formed on the substrate 101. The interfacial insulating film 110 may include a silicon oxide (e.g., $SiO_2$), a silicon nitride (e.g., $Si_3N_4$), a silicon oxynitride (e.g., SiON), or an aluminum oxide (e.g., $Al_2O_3$). The interfacial insulating film 110 may be formed using a chemical vapor deposition method, an atomic layer deposition method, or the like. The interfacial insulating film 110 may be formed in an amorphous state. The interfacial insulating film 110 may be formed in a thickness of about 1 nm to about 5 nm.

Then, a ferroelectric material film 120 may be formed on the interfacial insulating film 110. In an embodiment, the ferroelectric material film 120 may include a binary metal oxide. For example, the ferroelectric material film 120 may include a hafnium oxide (e.g., $HfO_2$), a zirconium oxide (e.g., $ZrO_2$), or a combination thereof. The ferroelectric material film 120 may be formed using a chemical vapor deposition method, an atomic layer deposition method, or the like. The ferroelectric material film 120 may be formed in a thickness of about 3 nm to about 15 nm.

In an embodiment, the ferroelectric material film 120 may include at least one dopant. The dopant may be distributed in the ferroelectric material film 120. For example, the ferroelectric material film 120 may include a dopant having a valence of 2 to 4. The dopant can stably maintain the ferroelectricity of the ferroelectric material film 120 after the ferroelectric material film 120 is crystallized. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof. In an embodiment, the dopant may be provided together with a source chemical material of the ferroelectric material film 120 when forming the ferroelectric material film 120. In another embodiment, the dopant may be provided into the ferroelectric material film 120 by an ion implantation method after the formation of the ferroelectric material film 120 is completed.

Then, a crystallization seed film 130 may be formed on the ferroelectric material film 120. The crystallization seed film 130 may include at least one of silicon (Si), germanium (Ge), silicon germanium (SiGe), or silicon carbide (SiC). The crystallization seed film 130 may be a polycrystalline silicon film. The crystallization seed film 130 may be formed using a chemical vapor deposition method, an atomic layer deposition method, or the like. In an embodiment, the crystallization seed film 130 may be formed at a temperature that is lower than a crystallization temperature of the ferroelectric material film 120. In an embodiment, when the ferroelectric material film 120 is a hafnium oxide film or a zirconium oxide film, the process of forming the crystallization seed film 130 may be performed at a process temperature that is lower than 500° C.

Figure 4A:
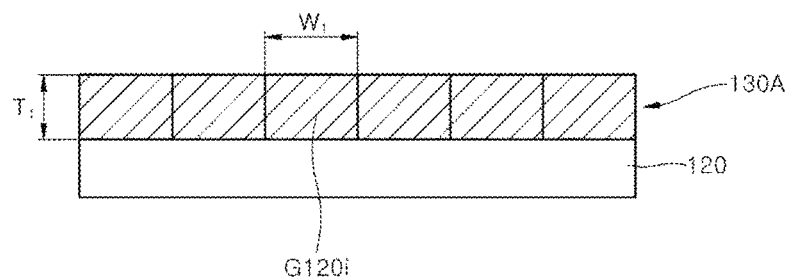
Figure 4B:
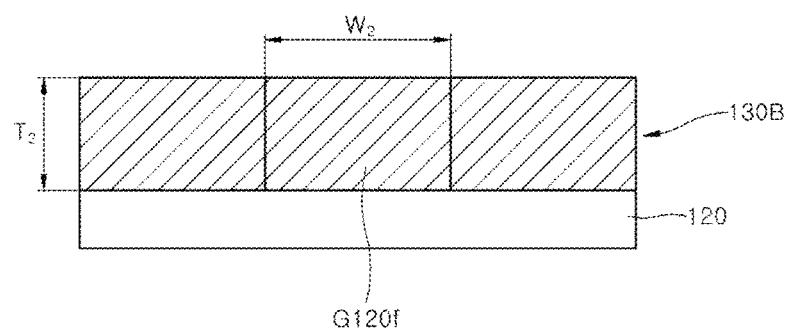

FIGS. 4A and 4B are cross-sectional views each illustrating a process of forming a crystallization seed film according to embodiments of the present disclosure. More specifically, FIG. 4A illustrates a state in which a crystallization seed film 130A having a first thickness $T_1$ is formed on the ferroelectric material film 120 by performing a film formation process for a first time period, and FIG. 4B illustrates a state in which a crystallization seed film 130B having a second thickness $T_2$ is formed on the ferroelectric material film 120 by performing a film formation process for a second time period that is longer than the first time period. For convenience of description, the substrate 101 and the interfacial insulating layer 110 are omitted in FIGS. 4A and 4B.

Referring to FIG. 4A, the crystallization seed film 130A having the first thickness $T_1$ may include crystal grains G120i having an average size of a first width $W_1$. In contrast, referring to FIG. 4B, the crystallization seed film 130B having the second thickness $T_2$ may include crystal grains G120f having an average size of a second width $W_2$, the second width $W_2$ being greater than the first width $W_1$. That is, as the thickness of the crystallization seed film is increased, the crystal grain size of the crystallization seed film can be increased. As the crystal grain size of the crystallization seed film is increased, the number of crystal grains per unit volume of the crystallization seed film is decreased. For convenience of description, FIGS. 4B and 5 show the crystallization seed film that includes three crystal grains G120f having an average size of the second width $W_2$.

In an embodiment, the process of forming the crystallization seed film 130 may be performed as follows. At first, a final crystal grain size of the crystallization seed film 130 and a thickness of the crystallization seed film 130 corresponding to the final crystal grain size may be determined. Next, the crystallization seed film 130 may be formed to have the determined crystal grain size and thickness by controlling conditions of a film deposition process. The method of controlling the conditions of the film deposition process may include controlling a process temperature, a process time, a process pressure, and the like. For example, the final crystal grain size of the crystallization seed film 130 may be obtained by controlling the thickness of the crystallization seed film 130.

Figure 5:
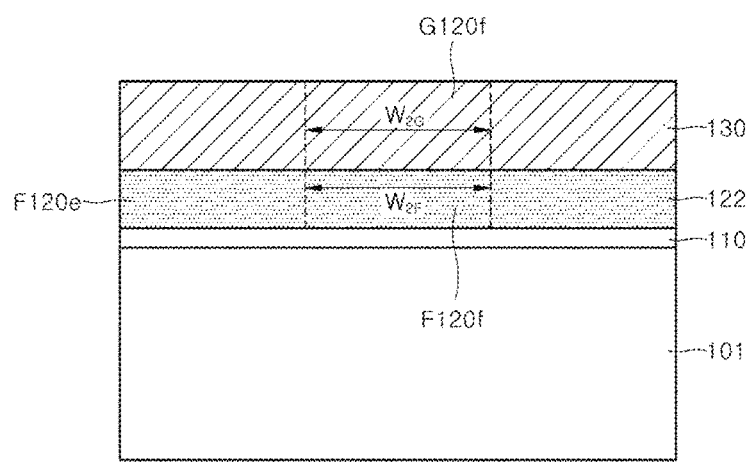

Referring to FIG. 5, heat-treatment for the ferroelectric material film 120 may be performed in a state of the crystallization seed film 130 covering the ferroelectric material film 120. That is, the crystallization seed film 130 may be in contact with the ferroelectric material film 120 during the heat-treatment. Accordingly, the crystallization seed film 130 may induce crystallization of the amorphous ferroelectric material film 120 during the heat-treatment. The heat-treatment may be performed at a process temperature of about 500° C. to about 1000° C. The heat-treatment may be performed in a gaseous atmosphere including nitrogen ($N_2$), oxygen ($O_2$), hydrogen ($H_2$), argon (Ar), or a combination thereof.

The amorphous ferroelectric material film 120 may be converted into a crystalline ferroelectric film 122 by performing the heat-treatment. In an embodiment, a crystal grain size of the ferroelectric film 122 may be substantially the same as the crystal grain size of the crystallization seed film 130. For example, as shown in FIG. 5, an average size $W_{2F}$ of crystal grains F120f of the ferroelectric film 122 may be substantially the same as the average size $W_{2G}$ of the crystal grains G120f of the crystallization seed film 130.

Figure 6:
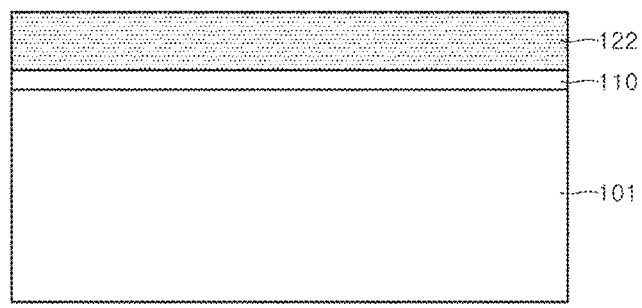

Referring to FIG. 6, the crystallization seed film 130 of FIG. 5 may be removed to expose the ferroelectric film 122. In an embodiment, the crystallization seed film 130 may be removed using an etching method or a grinding method. In a specific embodiment, when the crystallization seed film 130 is a polycrystalline silicon film, the polycrystalline silicon film may be oxidized to be converted into a silicon oxide film, and then the silicon oxide film may be etched to expose the ferroelectric film 122. For example, a wet etching method using an etching solution such as a hydrofluoric acid or a buffer oxide etchant may be performed to remove the crystallization seed film 130.

Figure 7:
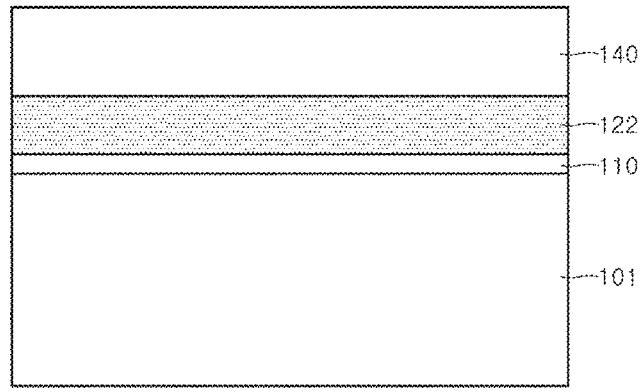

Referring to FIG. 7, an electrode film 140 may be formed on the ferroelectric film 122. The electrode film 140 may include titanium (Ti), tantalum (Ta), tungsten (W), titanium nitride (TiN), tantalum nitride (TaN), tungsten nitride (WN), or a combination thereof. The electrode film 140 may be formed using a physical vapor deposition method, a chemical vapor deposition method, an atomic layer deposition method, or the like.

Figure 8:
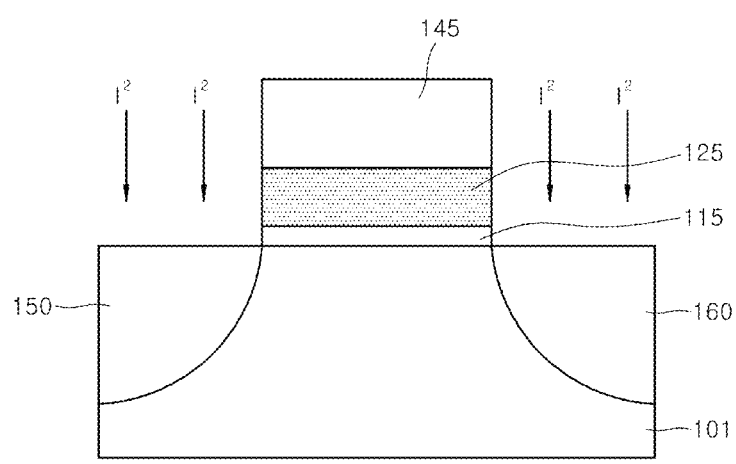

Referring to FIG. 8, the electrode film 140, the ferroelectric film 122, and the interfacial insulating film 110 may be patterned. As a result, an interfacial insulating layer 115, a ferroelectric layer 125, and a gate electrode layer 145 that are sequentially stacked on the substrate 101 may be formed. In addition, a dopant may be selectively implanted into regions of the substrate 101 that are exposed as a result of the patterning process. In an embodiment, the dopant may be implanted using an ion implantation ($I^2$) method. As a result, a source region 150 and a drain region 160 may be formed in the exposed regions of the substrate 101 at both ends or on opposite sides of the gate electrode layer 145.

By performing the above processes described with reference to FIGS. 3 to 8, the ferroelectric device according to the embodiment of the present disclosure can be manufactured. In some embodiments, the ferroelectric film 122 and the crystallization seed film 130 shown in FIG. 5 may have different lattice constants. For example, when the ferroelectric film 122 includes hafnium oxide ($HfO_2$), the hafnium oxide ($HfO_2$) has a lattice constant of about 5.1 Å. At this time, the crystallization seed film 130 may include silicon carbide (SiC), silicon (Si), germanium (Ge), silicon germanium (SiGe), or a combination thereof. Silicon carbide (SiC) has a lattice constant of about 4.35 Å; silicon (Si) has a lattice constant of about 5.43 Å; germanium (Ge) has a lattice constant of about 5.65 Å; and silicon germanium (SiGe) has a lattice constant that is between the lattice constants of silicon (Si) and germanium (Ge).

During the crystallization heat-treatment for the ferroelectric material film 120, lattice strain may be generated at an interface between the ferroelectric film 122 and the crystallization seed film 130 because of a difference in lattice constants of the ferroelectric film 122 and the crystallization seed film 130. The lattice strain may generate a gradient of the lattice strain from an interface of the ferroelectric film 122 and the crystallization seed film 130 into the ferroelectric film 122. The gradient of the lattice strain may generate a flexoelectric effect in the ferroelectric film 122, thereby forming an electric field within the ferroelectric film 122. The electric field formed within the ferroelectric film 122 can improve a polarization alignment in the ferroelectric film 122, thereby stabilizing a ferroelectric characteristic of the ferroelectric film 122. The ferroelectric characteristic may include remanent polarization, a coercive electric field, or the like.

Figure 9:
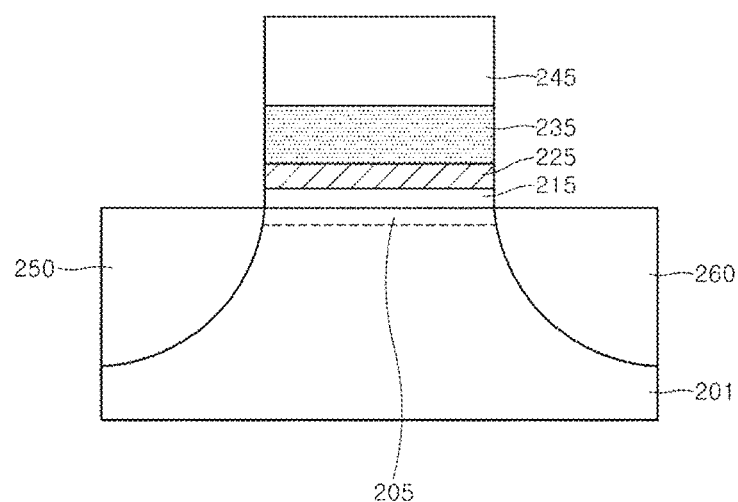
FIG. 9 is a cross-sectional view schematically illustrating a ferroelectric device according to another embodiment of the present disclosure.

FIG. 9 is a cross-sectional view schematically illustrating a ferroelectric device 2 according to another embodiment of the present disclosure. Referring to FIG. 9, the ferroelectric device 2 may include a substrate 201, an interfacial insulating layer 215, a crystallization seed layer 225, a ferroelectric layer 235, and a gate electrode layer 245. In an embodiment, the ferroelectric device 2 may be a transistor type memory device that implements different channel resistances depending on a polarization orientation written in the ferroelectric layer 235.

A configuration of the ferroelectric device 2 may be substantially the same as that of the ferroelectric device 1 described above with reference to FIG. 1, except that the crystallization seed layer 225 is added between the interfacial insulating layer 215 and the ferroelectric layer 235. More specifically, the substrate 201, a channel region 205, the interfacial insulating layer 215, the ferroelectric layer 235, the gate electrode layer 245, a source region 250, and a drain region 260 of the ferroelectric device 2 may be substantially the same as the substrate 101, the channel region 105, the interfacial insulating layer 115, the ferroelectric layer 125, the gate electrode layer 145, the source region 150, and the drain region 160 of the ferroelectric device 1, respectively. A write operation and a read operation of the ferroelectric device 2 may be substantially the same as the write operation and the read operation described above with reference to FIG. 1. Therefore, the description for the above components and the write and read operations of the ferroelectric device 2 are omitted to exclude redundancy.

Referring to FIG. 9, the crystallization seed layer 225 may be disposed on the interfacial insulating layer 215. The crystallization seed layer 225 may be a dielectric layer having a greater dielectric constant than the interfacial insulating layer 215. Unlike the ferroelectric layer 235, the crystallization seed layer 225 may not have ferroelectric characteristics. The crystallization seed layer 225 may include a titanium oxide (e.g., $TiO_2$), a tantalum oxide (e.g., $Ta_2O_5$), an aluminum oxide (e.g., $Al_2O_3$), a strontium titanium oxide (e.g., $SrTiO_3$), a barium titanium oxide (e.g., $BaTiO_3$), a yttrium titanium oxide (e.g., $Y_2Ti_2O_7$), or a combination thereof.

The crystallization seed layer 225 may be formed to have a predetermined crystal grain size. The crystallization seed layer 225 may have a thickness of about 1 nm to about 10 nm. The crystallization seed layer 225 may function as a dielectric layer of a gate capacitor together with the interfacial insulating layer 215 and the ferroelectric layer 235 between the substrate 101 and the gate electrode layer 245.

Figure 10:
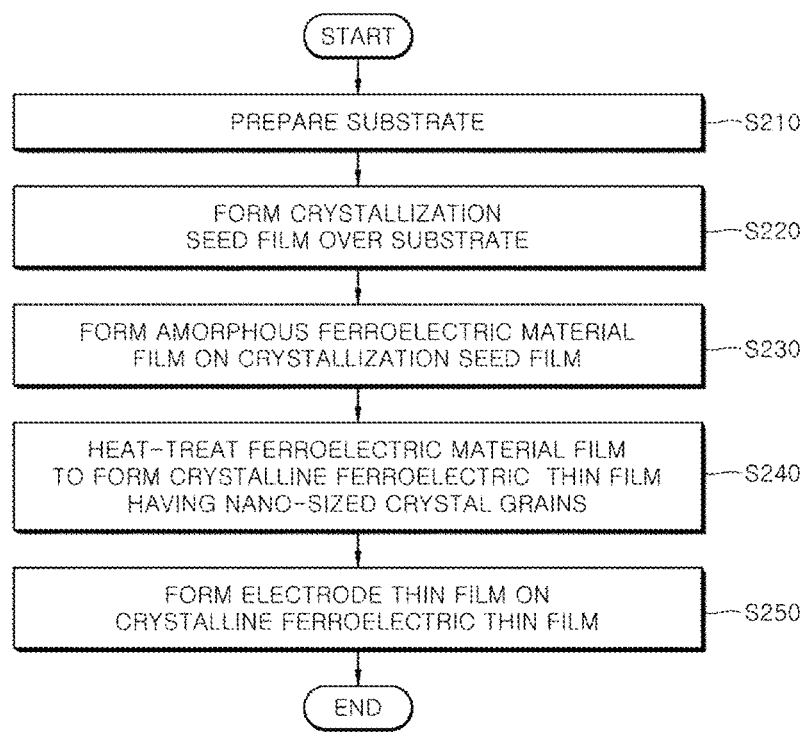
FIG. 10 is a flow chart schematically illustrating a method of manufacturing a ferroelectric device according to another embodiment of the present disclosure.

FIG. 10 is a flow chart schematically illustrating a method of manufacturing a ferroelectric device according to another embodiment of the present disclosure.

At step S210, a substrate may be prepared. The substrate may include a semiconductor material. For example, the substrate may be a p-type doped silicon substrate.

At step S220, a crystallization seed film may be formed over the substrate. The crystallization seed film may have a crystalline structure. The crystallization seed film may include a dielectric material. The crystallization seed film may function as a part of a gate dielectric layer in a manufactured ferroelectric device. Therefore, in order to secure a high dielectric constant of the gate dielectric layer, the crystallization seed film may be formed to have a sufficiently reduced thickness.

In an embodiment, the crystallization seed film may be formed as follows. At first, a crystalline dielectric film having a predetermined crystal grain size and a first thickness may be formed over the substrate. Then, the crystalline dielectric film may be etched or ground to reduce the first thickness to a second thickness that is smaller than the first thickness. As a result, the crystallization seed film may be formed as the crystalline dielectric film having the second thickness. The second thickness may be about 1 nm to about 10 nm.

The crystallization seed film may include a titanium oxide (e.g., $TiO_2$), a tantalum oxide (e.g., $Ta_2O_5$), an aluminum oxide (e.g., $Al_2O_3$), a strontium titanium oxide (e.g., $SrTiO_3$), a barium titanium oxide (e.g., $BaTiO_3$), a yttrium titanium oxide (e.g., $Y_2Ti_2O_7$), or a combination thereof. In an embodiment, the crystallization seed film may be an aluminum oxide film.

At step S230, an amorphous ferroelectric material film may be formed on the crystallization seed film. The ferroelectric material film may include a hafnium oxide (e.g., $HfO_2$), a zirconium oxide (e.g., $ZrO_2$), or a combination thereof. The ferroelectric material film may further include a dopant. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof. In an embodiment, the ferroelectric material film may be a hafnium oxide layer into which silicon (Si) is implanted as a dopant. In another embodiment, the ferroelectric material film may be an undoped hafnium oxide layer.

At step S240, heat-treatment may be performed on the ferroelectric material film and the crystallization seed film to form a crystalline ferroelectric film. In an embodiment, the heat-treatment for the ferroelectric material film may be performed in a state in which the crystallization seed film and the ferroelectric material film are in contact with each other. Accordingly, the crystallization seed film may induce the crystallization of the amorphous ferroelectric material film in the heat-treatment process. The heat-treatment may be performed in a gaseous atmosphere including nitrogen ($N_2$), oxygen ($O_2$), hydrogen ($H_2$), argon (Ar), or a combination thereof. The heat-treatment may be performed at a temperature of about 500° C. to about 1000° C.

In an embodiment, a crystal grain size of the crystalline ferroelectric film generated by the heat-treatment may be substantially the same as a crystal grain size of the crystallization seed film. Therefore, the crystallization seed film may be formed at step S220 by considering the crystal grain size of the crystalline ferroelectric film, and the crystal grain size of the crystalline ferroelectric film may be controlled through the heat-treatment at step S240.

At step S250, an electrode film may be formed on the crystalline ferroelectric film. The electrode film may include titanium (Ti), tantalum (Ta), tungsten (W), titanium nitride (TiN), tantalum nitride (TaN), tungsten nitride (WN), or a combination thereof.

Although not shown in FIG. 10, a process of patterning the electrode film, the crystalline ferroelectric film, and the crystallization seed film may be further performed. As a result, a crystallization seed layer, a ferroelectric layer, and a gate electrode layer may be formed on the substrate. In addition, a process of selectively implanting a dopant into regions of the substrate that are exposed as a result of the patterning process may be performed. As a result, a source region and a drain region may be formed in the exposed regions of the substrate at both ends or on opposite sides of the gate electrode layer.

In some other embodiments, before step S220, an interfacial insulating film may be formed on the substrate, so that the interfacial insulating film is disposed between the substrate and the crystallization seed film. The interfacial insulating film may include a silicon oxide (e.g., $SiO_2$), a silicon nitride (e.g., $Si_3N_4$), a silicon oxynitride (e.g., SiON), or an aluminum oxide (e.g., $Al_2O_3$). Subsequently, after steps S230 through S250 are performed, the interfacial insulation film, the crystallization seed film, the crystalline ferroelectric film, and the electrode film sequentially stacked on the substrate may be patterned to form an interfacial insulation layer, the crystallization seed layer, the ferroelectric layer, and the gate electrode layer.

By performing the above-described processes, a ferroelectric device is manufactured. In some embodiments, the crystallization seed film may have a different lattice constant from a lattice constant of the ferroelectric film. For example, when the ferroelectric film has a hafnium oxide ($HfO_2$), the hafnium oxide has a lattice constant of about 5.1 Å. At this time, the crystallization seed film may include silicon carbide (SiC), silicon (Si), germanium (Ge), silicon germanium (SiGe), or a combination thereof. Silicon carbide (SiC) has a lattice constant of about 4.35 Å; silicon (Si) has a lattice constant of about 5.43 Å; germanium (Ge) has a lattice constant of about 5.65 Å; and silicon germanium (SiGe) has a lattice constant that is between the lattice constant of silicon (Si) and the lattice constant of germanium (Ge).

Accordingly, in the crystallization heat-treatment process at step S240, lattice strain may be generated in the crystalline ferroelectric film where crystallization proceeds because of a difference in the lattice constants of the ferroelectric film and the crystallization seed film. Specifically, the lattice strain may generate a gradient of the lattice strain from an interface between the ferroelectric film and the crystallization seed film into the ferroelectric film. The gradient of the lattice strain may generate a flexoelectric effect in the ferroelectric film to form an electric field within the ferroelectric film. Consequently, the electric field formed within the ferroelectric film can improve a polarization alignment in the ferroelectric film, thereby stabilizing ferroelectric characteristics of the ferroelectric film. The ferroelectric characteristics may include remanent polarization, a coercive electric field, and the like.

Figure 11:
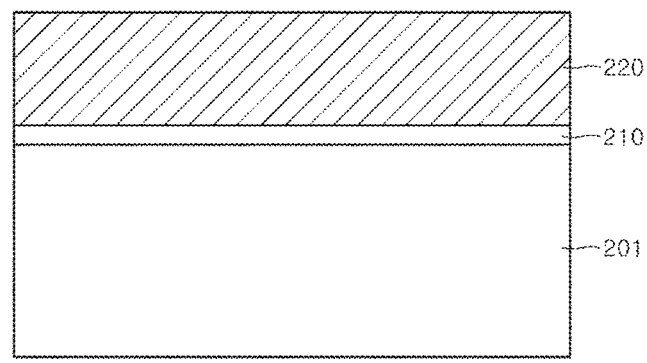
FIGS. 11 to 17 are cross-sectional views schematically illustrating a method of manufacturing a ferroelectric device according to another embodiment of the present disclosure.

FIGS. 11 to 17 are cross-sectional views schematically illustrating a method of manufacturing a ferroelectric device according to another embodiment of the present disclosure. Referring to FIG. 11, a substrate 201 may be prepared. The substrate 201 may include a semiconductor material. The substrate 201 may be a silicon (Si) substrate, a gallium arsenide (GaAs) substrate, an indium phosphide (InP) substrate, a germanium (Ge) substrate, or a silicon germanium (SiGe) substrate. In an embodiment, the substrate 201 may be doped to have conductivity. For example, the substrate 201 may be doped with a p-type or n-type dopant. In an embodiment, the substrate 201 may be a p-type doped silicon substrate.

Next, an interfacial insulating film 210 may be formed on the substrate 201. The interfacial insulating film 210 may include a silicon oxide (e.g., $SiO_2$), a silicon nitride (e.g., $Si_3N_4$), a silicon oxynitride (e.g., SiON), or an aluminum oxide (e.g., $Al_2O_3$). The interfacial insulating film 210 may be formed using a chemical vapor deposition method, an atomic layer deposition method, or the like. The interfacial insulating film 210 may be formed in an amorphous state. The interfacial insulating film 210 may have a thickness of about 1 nm to about 5 nm.

Then, a crystalline dielectric film 220 having a predetermined grain size and a predetermined thickness may be formed on the interfacial insulating film 210. At this time, the grain size may represent a grain width that is measured in a lateral direction parallel to a top surface of the substrate 201. A dielectric constant of the dielectric film 220 may be greater than that of the interfacial insulating layer 210. The dielectric film 220 may include a titanium oxide (e.g., $TiO_2$), a tantalum oxide (e.g., $Ta_2O_5$), an aluminum oxide (e.g., $Al_2O_3$), a strontium titanium oxide (e.g., $SrTiO_3$), a barium titanium oxide (e.g., $BaTiO_3$), a yttrium titanium oxide (e.g., $Y_2Ti_2O_7$), or a combination thereof. The dielectric film 220 may be formed using a chemical vapor deposition method, an atomic layer deposition method, or the like.

Figure 12:
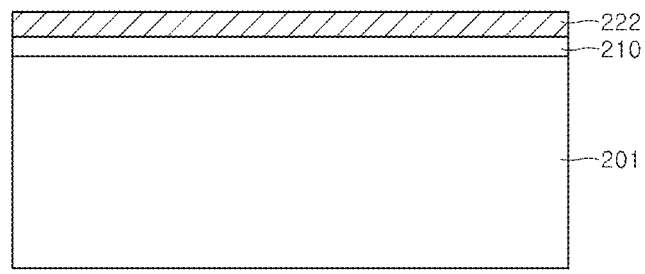

Referring to FIG. 12, a thickness of the dielectric film 220 may be reduced to form a crystallization seed film 222. The crystallization seed film 222 may have the same grain size as that of the dielectric film 220.

Figure 13A:
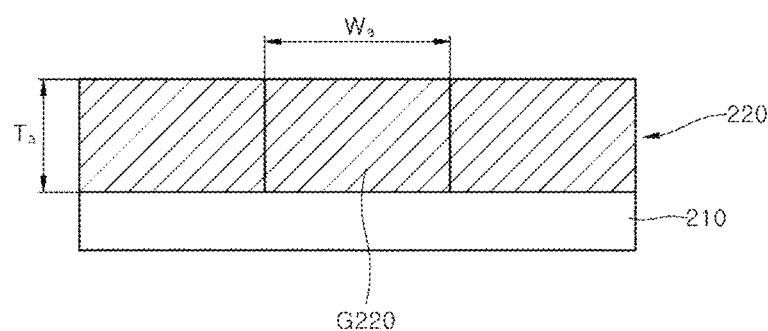
Figure 13B:
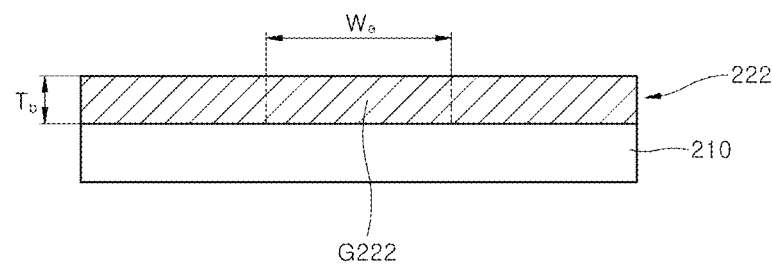

FIGS. 13A and 13B are cross-sectional views schematically illustrating a process of forming the crystallization seed film 222 from the dielectric film 220 according to an embodiment in the present disclosure. For convenience of description, the substrate 201 is omitted in FIGS. 13A and 13B.

Referring to FIG. 13A, the crystalline dielectric film 220 may be formed on the interfacial insulating film 210 and have a desired predetermined crystal grain size. The process of forming the crystalline dielectric film 220 is performed for a first time period. The dielectric film 220 may have a crystal grain size that is in proportion to the thickness of the dielectric film 220. For example, FIG. 13A illustrates the dielectric film 220, which has a first width $W_a$ as the desired predetermined crystal grain size and has a first thickness $T_a$.

Referring to FIG. 13B, the dielectric film 220 may be etched or ground to form the crystallization seed film 222 having a second thickness $T_b$ that is smaller than the first thickness $T_a$. The crystallization seed film 222 may have a thickness of about 1 nm to about 10 nm. The crystallization seed film 222 may have the same width as that of the dielectric film 220. That is, the crystallization seed film 222 may have the same crystal grain size as that of the dielectric film 220.

As illustrated in FIG. 13A, the dielectric film 220 having the first thickness $T_a$ may include crystal grains G220 having an average size of the first width $W_a$. As illustrated in FIG. 13B, the crystallization seed film 222 having the second thickness $T_b$ may include crystal grains G222 having an average size of the first width $W_a$.

In an embodiment, referring to FIGS. 11 and 12, the crystallization seed film 222 may be formed as follows. At first, an initial thickness of the dielectric film 220 capable of securing the crystal grain size of the crystallization seed film 222 may be determined. Next, the dielectric film 220 may be formed to have an initial thickness by controlling conditions of the film deposition process. The method of controlling the film deposition process may include controlling a process temperature, a process time, a process pressure, and the like. Then, a final thickness of the crystallization seed film 222 may be determined in consideration of a gate capacitance of the ferroelectric device. Subsequently, at least a portion of the dielectric film 220 may be removed to reduce the thickness so that the crystallization seed film 222 having a final thickness may be formed. An etching method or a grinding method may be used to reduce the thickness of the dielectric film 220. The etching method may be a dry etching method, a wet etching method, or a combination thereof. The grinding method may be a chemical mechanical polishing method. As illustrated in FIG. 12, the crystallization seed film 222 having the final thickness may be formed on the interfacial insulation film 210.

Figure 14:
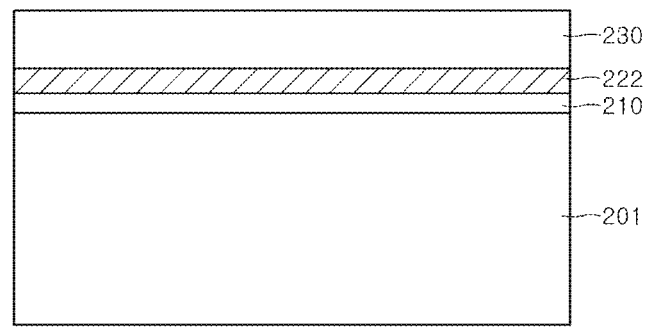

Referring to FIG. 14, a ferroelectric material film 230 may be formed on the crystallization seed film 222. The ferroelectric material film 230 may be formed in an amorphous state. In an embodiment, the ferroelectric material film 230 may include a binary metal oxide. For example, the ferroelectric material film 230 may include a hafnium oxide (e.g., $HrO_2$), a zirconium oxide (e.g., $ZrO_2$), or a combination thereof. The ferroelectric material film 230 may be formed using a chemical vapor deposition method, an atomic layer deposition method, or the like.

In an embodiment, the ferroelectric material film 230 may include at least one dopant. The dopant may be uniformly distributed in the ferroelectric material film 230. For example, when the ferroelectric material film 230 includes a hafnium oxide (e.g., $HfO_2$), a zirconium oxide (e.g., $ZrO_2$), or a combination thereof, the ferroelectric material film 230 may further include a dopant having a valence of 2 to 4. The dopant can function to stably maintain the ferroelectricity of the ferroelectric material film 230 after the ferroelectric material film 230 is crystallized. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof. In an embodiment, the dopant may be provided together with a source chemical material of the ferroelectric material film 230 when forming the ferroelectric material film 230. In another embodiment, the dopant may be implanted into the ferroelectric material film 230 by an ion implantation method after the formation of the ferroelectric material film 230 is completed.

Figure 15:
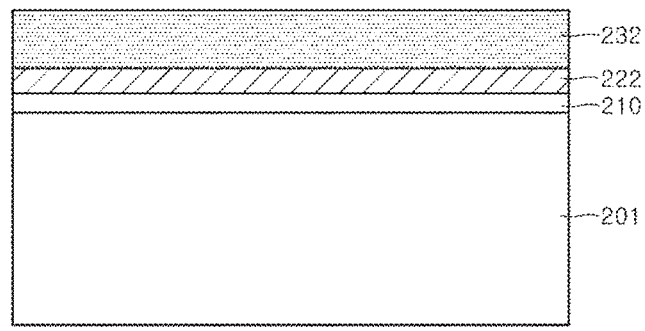

Referring to FIG. 15, a heat-treatment may be performed in a state of the ferroelectric material film 230 covering the crystallization seed film 222. The crystallization seed film 222 may induce crystallization of the amorphous ferroelectric material film 230 during the heat treatment process. For example, the heat-treatment may be performed at a process temperature of about 500° C. to about 1000° C. The heat-treatment may be performed in a gaseous atmosphere including nitrogen ($N_2$), oxygen ($O_2$), hydrogen ($H_2$), argon (Ar), or a combination thereof.

The amorphous ferroelectric material film 230 may be converted into a crystalline ferroelectric film 232 by performing the heat-treatment. In an embodiment, a crystal grain size of the ferroelectric film 232 after the heat-treatment may be substantially the same as the crystal grain size of the crystallization seed film 222.

Figure 16:
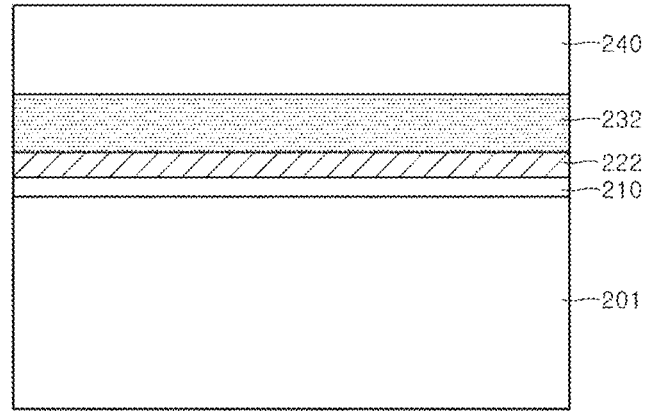

Referring to FIG. 16, an electrode film 240 may be formed on the ferroelectric film 232. The electrode film 240 may include titanium (Ti), tantalum (Ta), tungsten (W), titanium nitride (TiN), tantalum nitride (TaN), tungsten nitride (WN), or a combination thereof. The electrode film 240 may be formed using a physical vapor deposition method, a chemical vapor deposition method, an atomic layer deposition method, or the like.

Figure 17:
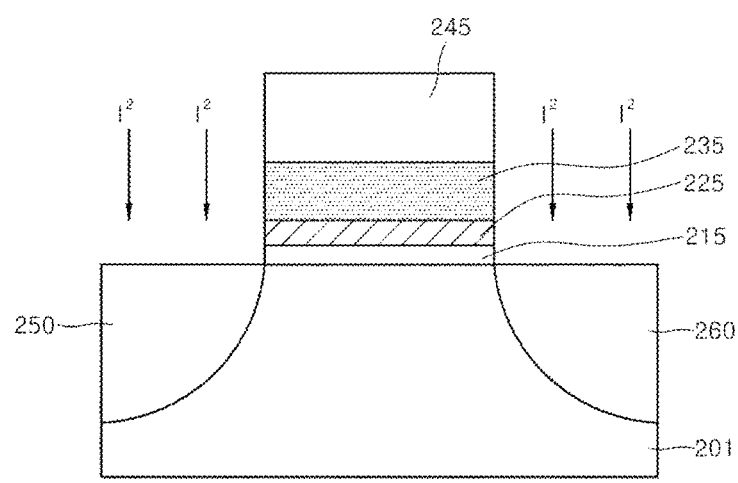

Referring to FIG. 17, the electrode film 240, the ferroelectric film 232, the crystallization seed film 222, and the interfacial insulating film 210 may be patterned. As a result, an interfacial insulating layer 215, a crystallization seed layer 225, a ferroelectric layer 235, and a gate electrode layer 245 stacked on the substrate 201 may be formed. After that, a dopant may be selectively implanted into regions of the substrate 101 that are exposed as a result of the patterning process. In an embodiment, the dopant may be implanted using an ion implantation ($I^2$) method. As a result, a source region 250 and a drain region 260 may be formed in the exposed regions of the substrate 201 at both ends or on opposite sides of the gate electrode layer 245.

By performing the above-described processes, the ferroelectric device according to the embodiment of the present disclosure may be manufactured. In some embodiments, the crystallization seed film 222 and the ferroelectric film 232 shown in FIG. 15 may have different lattice constants. For example, when the ferroelectric film 232 includes hafnium oxide ($HfO_2$), the hafnium oxide ($HfO_2$) has a lattice constant of about 5.1 Å. At this time, the crystallization seed film 222 may include silicon carbide (SiC), silicon (Si), germanium (Ge), silicon germanium (SiGe), or a combination thereof. Silicon carbide (SiC) has a lattice constant of about 4.35 Å; silicon (Si) has a lattice constant of about 5.43 Å; germanium (Ge) has a lattice constant of about 5.65 Å; and silicon germanium (SiGe) has a lattice constant that is between the lattice constant of silicon (Si) and the lattice constant of germanium (Ge).

Accordingly, during the heat-treatment for the ferroelectric material film 230, lattice strain may be generated at an interface between the crystallized ferroelectric film 232 and the crystallization seed film 222 because of a difference in lattice constants of the ferroelectric film 232 and the crystallization seed film 222. The lattice strain may generate a gradient of the lattice strain from the interface of the ferroelectric film 232 and the crystallization seed film 222 into the ferroelectric film 232. The gradient of the lattice strain may generate a flexoelectric effect in the ferroelectric film 232 to form an electric field within the ferroelectric film 232. The electric field formed within the ferroelectric film 232 can improve a polarization alignment in the ferroelectric film 232, thereby stabilizing ferroelectric characteristics of the ferroelectric film 232. The ferroelectric characteristics may include remanent polarization, a coercive electric field, and the like.

Figure 18:
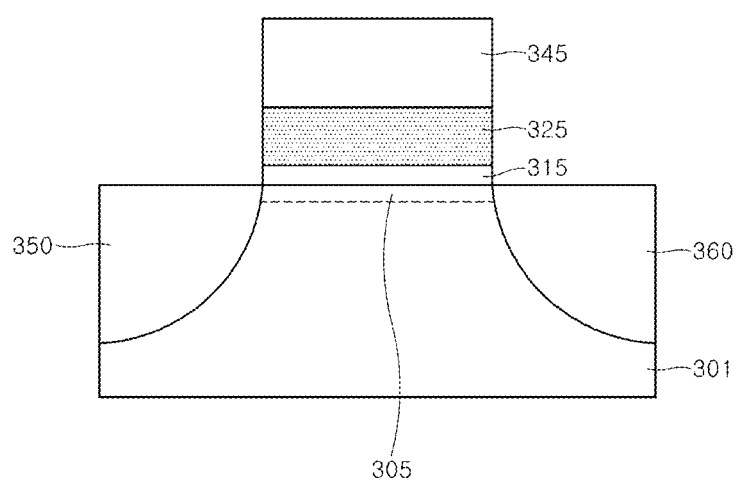
FIG. 18 is a cross-sectional view schematically illustrating a ferroelectric device according to another embodiment of the present disclosure.

FIG. 18 is a cross-sectional view schematically illustrating a ferroelectric device 3 according to another embodiment of the present disclosure. Referring to FIG. 18, the ferroelectric device 3 may include a substrate 301, an interfacial insulating layer 315, a ferroelectric layer 325, and a gate electrode layer 345. In an embodiment, the ferroelectric device 3 may be a transistor type memory device implementing different channel resistances depending on a polarization orientation written in the ferroelectric layer 325.

A configuration of the ferroelectric device 3 may be substantially the same as that of the ferroelectric device 1 described above with reference to FIG. 1, except a configuration of the ferroelectric layer 325. More specifically, the substrate 301, a channel region 305, the interfacial insulating layer 315, the gate electrode layer 345, a source region 350, and a drain region 360 of the ferroelectric device 3 may be substantially the same as the substrate 101, the channel region 105, the interfacial insulating layer 115, the gate electrode layer 145, the source region 150, and the drain region 160 of the ferroelectric device 1, respectively. A write operation and a read operation of the ferroelectric device 3 may be substantially the same as the write operation and the read operation of the ferroelectric device 1 described above with reference to FIG. 1. Therefore, the description for the above components and the write and read operations of the ferroelectric device 3 are omitted to exclude redundancy.

Referring to FIG. 18, the ferroelectric layer 325 may include nano-sized crystal grains. In the ferroelectric layer 325 including the nano-sized crystal grains, an average size of the crystal grains is smaller than a thickness of the ferroelectric layer 325. For example, the ferroelectric layer 325 may have a thickness of about 3 nm to about 15 nm, and the average crystal grain size of the ferroelectric layer 325 may be smaller than the thickness of the ferroelectric layer 325.

Figure 19:
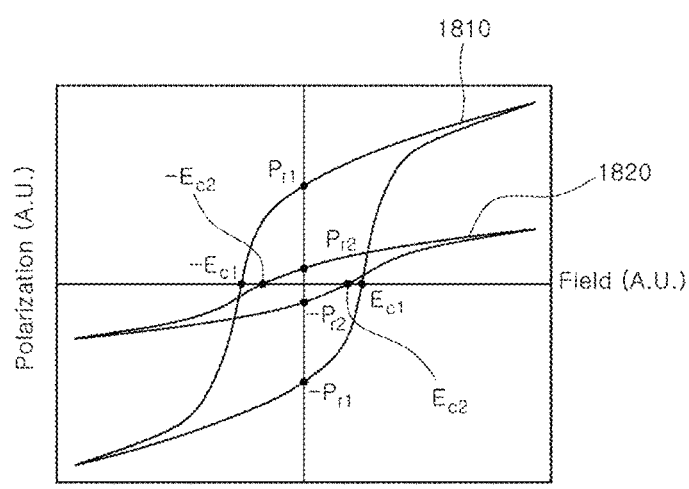
FIG. 19 is a graph schematically illustrating ferroelectric characteristics of a ferroelectric layer according to an embodiment of the present disclosure.

FIG. 19 is a graph schematically illustrating ferroelectric characteristics of a ferroelectric layer according to a size of a crystal grain in accordance with an embodiment of the present disclosure. More specifically, a first graph 1810 and a second graph 1820 are hysteresis curves showing polarization characteristics of first and second ferroelectric layers having different crystal grain sizes, respectively. The crystal grain size of the second ferroelectric layer corresponding to the second graph 1820 is smaller than the crystal grain size of the first ferroelectric layer corresponding to the first graph 1810.

Referring to FIG. 19, magnitudes of coercive electric fields $E_{c2}$ and $-E_{c2}$ of the second graph 1820 are smaller than magnitudes of coercive electric fields $E_{c1}$ and $-E_{c1}$ of the first graph 1810, respectively. A magnitude of a coercive electric field formed in a ferroelectric layer may be proportional to the ability to resist polarization switching when an external electric field is applied to the ferroelectric layer. Accordingly, when external electric fields of the same magnitude are applied to the first and second ferroelectric layers, the second ferroelectric layer, having the smaller coercive electric fields $E_{c2}$ and $-E_{c2}$ than the first ferroelectric layer may have a faster driving speed for the polarization switching than the first ferroelectric layer. In addition, the polarization switching can be performed in a relatively low electric field. As a result, by employing the ferroelectric layer 325 including nano-sized crystal grains, the polarization switching speed of the ferroelectric device can be increased. As a result, a write operation speed of a ferroelectric element can be improved.

According to an embodiment of the present disclosure, the nano-sized crystal grains can be obtained by controlling the concentration of a dopant doped in the ferroelectric layer 325 or by controlling the conditions of the heat-treatment for the ferroelectric layer 325. In an embodiment, the ferroelectric layer 325 may include a hafnium oxide (e.g., $HfO_2$), a zirconium oxide (e.g., $ZrO_2$), or a combination thereof. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof.

Figure 20:
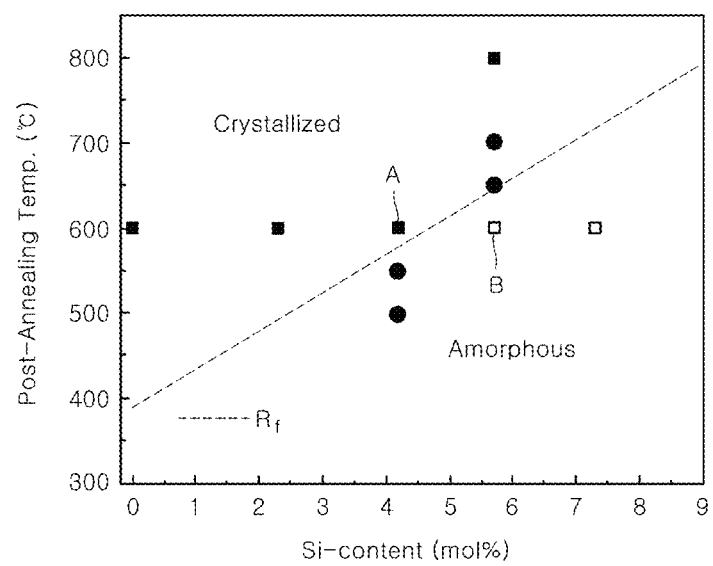
FIG. 20 is a view illustrating a crystal structure of a ferroelectric layer according to an embodiment of the present disclosure.

FIG. 20 is a view illustrating a crystal structure of a ferroelectric layer according to a dopant concentration and a subsequent heat-treatment in an embodiment of the present disclosure. Specifically, in this embodiment, a titanium nitride (TiN) layer of 10 nm thickness was used as a lower electrode; an amorphous silicon-doped hafnium oxide (Si:HfO$_2$) layer of 8 nm thickness was used as a ferroelectric material layer; and a titanium nitride (TiN) layer of 10 nm thickness was used as an upper electrode. The titanium nitride (TiN) layer, the amorphous silicon-doped hafnium oxide (Si:HfO$_2$) layer, and the titanium nitride (TiN) layer were stacked, and then a post-annealing process was performed on the stacked layers in a nitrogen (N$_2$) atmosphere. Crystallization degrees of a hafnium oxide layer were measured by changing the content of silicon doped in the hafnium oxide layer and an annealing temperature.

Referring to FIG. 20, it is observed that crystalline hafnium oxide layers are present over a reference line R$_f$, and amorphous hafnium oxide layers are present below the reference line R$_f$, on the basis of the reference line R$_f$. In this embodiment, conditions of generating a hafnium oxide layer having nano-sized crystal grains smaller than 8 nm are present near the reference line R$_f$. That is, at the boundary between the crystalline hafnium oxide layer and the amorphous hafnium oxide layer, the hafnium oxide layer having the nano-sized crystal grains is formed by controlling the silicon dopant content and the post-annealing temperature as shown in FIG. 20.

Figure 21:
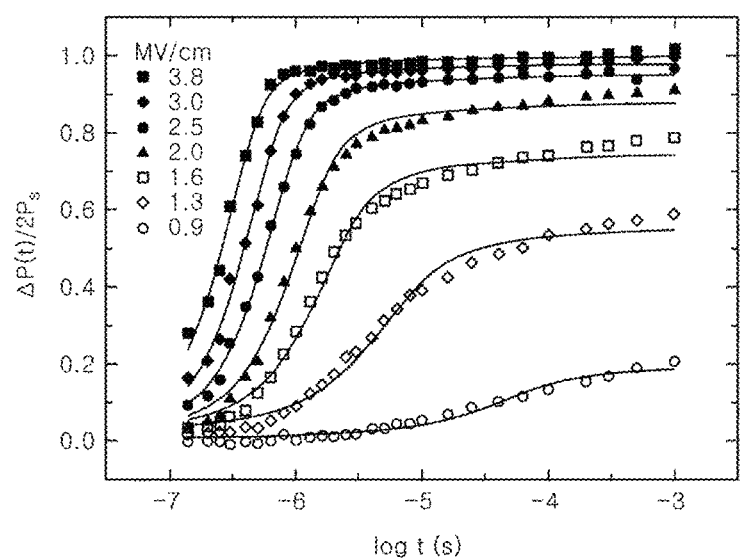
FIGS. 21 and 22 are graphs illustrating polarization changes according to an embodiment of the present disclosure.
Figure 22:
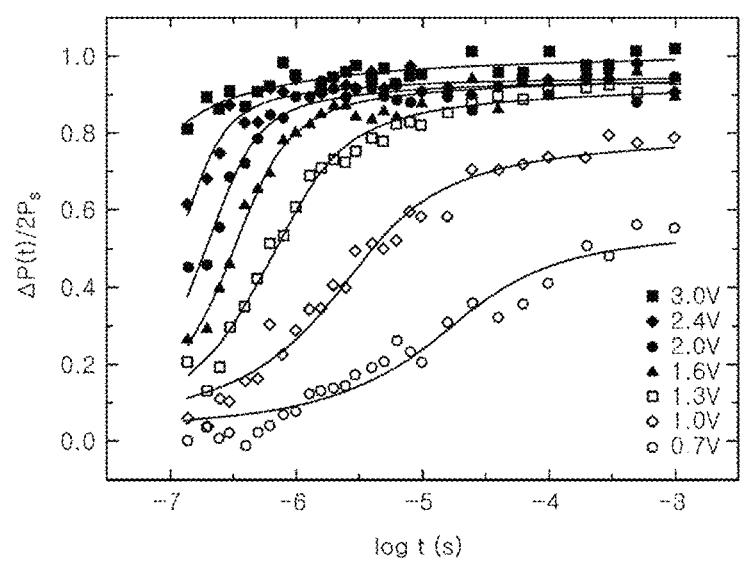

FIGS. 21 and 22 are graphs illustrating polarization variations according to an electric field application time in accordance with embodiments of the present disclosure.

FIG. 21 shows a test result for a stacked structure of a titanium nitride layer of 10 nm thickness, a silicon-doped hafnium oxide layer of 8 nm thickness, and a titanium nitride layer of 10 nm thickness, which are formed in a condition of silicon (Si) dopant content of 4.2 mol % and a post heat-treatment temperature of 600° C. corresponding to a point A in FIG. 20.

FIG. 22 shows a test result for a stacked structure of a titanium nitride layer of 10 nm thickness, a silicon-doped hafnium oxide layer of 10 nm thickness, and a titanium nitride layer of 10 nm thickness, which are formed in a condition of silicon (Si) dopant content of 5.7 mol % and a post heat-treatment temperature of 600° C. corresponding to a point B in FIG. 20.

More specifically, the polarization variation ΔP according to the application time t was observed when the applied electric field was fixed. In FIGS. 21 and 22, the Y-axis represents the polarization variation ΔP that is divided by two times the saturation polarization Ps, so that the polarization variation ΔP was expressed as a ratio with respect to the maximum changeable amount, and the X-axis represents a logarithmic value of time.

Referring to FIGS. 21 and 22, in each of the graphs, it can be seen that as the magnitude of the applied electric field (MV/cm) increases, the polarization variation ΔP increases at a certain time. It can also be seen that as the magnitude of the applied electric field (MV/cm) increases, a time required for the polarization switching to reach a saturation state becomes faster.

However, when comparing FIG. 22 with FIG. 21, when a hafnium oxide layer has the B point condition, it can be confirmed that the polarization variation ΔP is relatively great at the initial application time of the electric field as shown in FIG. 22. That is, it can be confirmed that the polarization switching speed is fast. As a result of the actual observation of the structure, the B point condition satisfied the requirements for the ferroelectric layer having nano-sized crystal grains more faithfully than the A point condition.

In an embodiment of the present disclosure, the ferroelectric layer 325 of FIG. 18 may have a thickness of about 3 nm to about 15 nm. The ferroelectric layer 325 may include a dopant of about 4 mol % to about 6 mol %. In addition, the ferroelectric layer 325 may be deposited as a ferroelectric material layer in an amorphous state, and then be crystallized to have nano-sized crystal grains by performing heat treatment at about 500° C. to about 1000° C.

Figure 23:
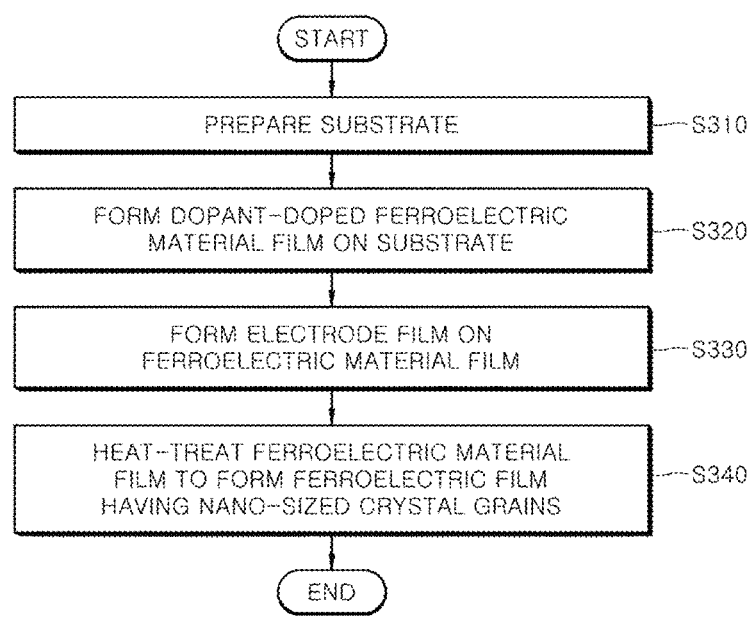
FIG. 23 is a flow chart schematically illustrating a method of manufacturing a ferroelectric device according to another embodiment of the present disclosure.

FIG. 23 is a flow chart schematically illustrating a method of manufacturing a ferroelectric device according to another embodiment of the present disclosure.

At step S310, a substrate may be prepared. The substrate may include a semiconductor material. For example, the substrate may be a p-type doped silicon substrate.

At step S320, a ferroelectric material film doped with a dopant may be formed on the substrate. The ferroelectric material film may have an amorphous structure. The ferroelectric material film may include a hafnium oxide (e.g., HfO$_2$), a zirconium oxide (e.g., ZrO$_2$), or a combination thereof. The ferroelectric material film may further include a dopant. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Gd), lanthanum (La), or a combination thereof. The ferroelectric material film may be formed using a chemical vapor deposition method or an atomic layer deposition method.

At step S330, an electrode film may be formed on the ferroelectric material film. The electrode film may include titanium (Ti), tantalum (Ta), tungsten (W), titanium nitride (TiN), tantalum nitride (TaN), tungsten nitride (WN), or a combination thereof.

At step S340, heat-treatment may be performed on the ferroelectric material film to form a ferroelectric film including nano-sized crystal grains. In an embodiment, the heat-treatment may be performed in a state of the electrode film covering the ferroelectric material film. The heat-treatment may be performed in a gaseous atmosphere including nitrogen (N$_2$), oxygen (O$_2$), hydrogen (H$_2$), argon (Ar), or a combination thereof. The heat-treatment may be performed at a temperature of about 500° C. to about 1000° C.

Although not illustrated in FIG. 23, a process of patterning the electrode film and the ferroelectric film may be further performed after the heat-treatment is performed. As a result, a ferroelectric layer and a gate electrode layer may be formed on the substrate. In addition, a process of selectively implanting a dopant into regions of the substrate that are exposed as a result of the patterning process may be further performed. As a result, a source region and a drain region may be formed in the exposed regions of the substrate at both ends or on opposite sides of the gate electrode layer.

In some other embodiments, before step S320, an interfacial insulating film may be formed on the substrate before the ferroelectric material film is formed. The interfacial insulating film may include a silicon oxide (e.g., SiO$_2$), a silicon nitride (e.g., Si$_3$N$_4$), a silicon oxynitride (e.g., SiON), or an aluminum oxide (e.g., Al$_2$O$_3$). Then, after performing steps S330 and S340, the interfacial insulating film, the ferroelectric film, and the electrode film sequentially stacked on the substrate may be patterned to form an interfacial insulating layer, the ferroelectric layer, and the gate electrode layer. By performing the above described processes, the ferroelectric device according to the embodiment of the present disclosure is manufactured.

Figure 24:
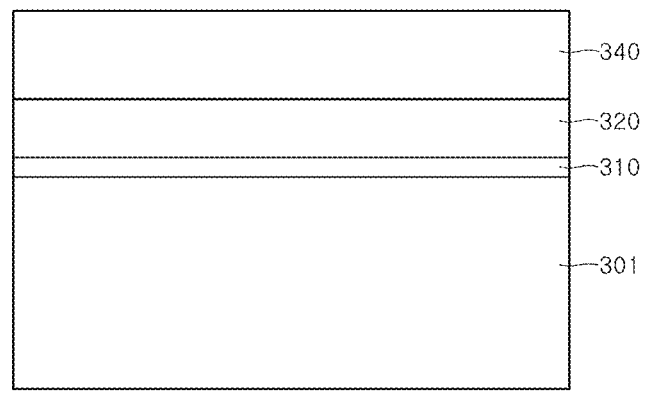
FIGS. 24 to 26 are cross-sectional views schematically illustrating a method of manufacturing a ferroelectric device according to another embodiment of the present disclosure.
Figure 25:
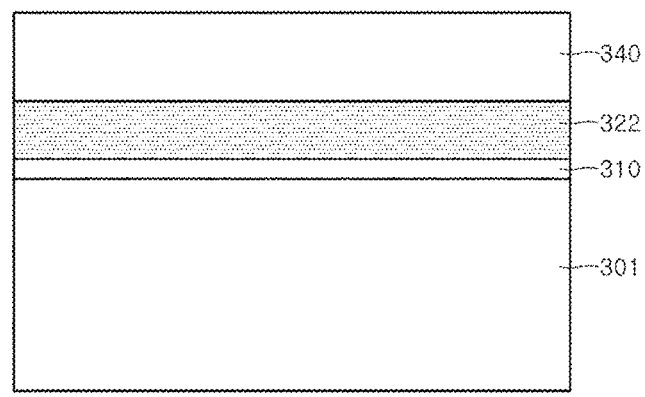
Figure 26:
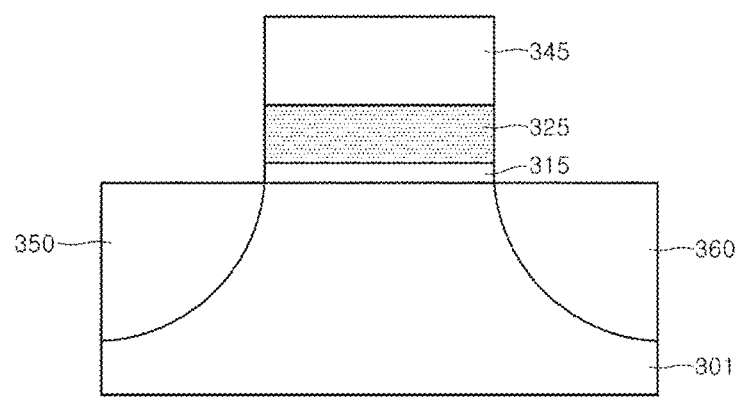

FIGS. 24 to 26 are cross-sectional views schematically illustrating a method of manufacturing a ferroelectric device according to another embodiment of the present disclosure. Referring to FIG. 24, a substrate 301 may be prepared. The substrate 301 may include a semiconductor material. The substrate 301 may be a silicon (Si) substrate, a gallium arsenide (GaAs) substrate, an indium phosphide (InP) substrate, a germanium (Ge) substrate, or a silicon germanium (SiGe) substrate. The substrate 301 may be doped to have conductivity. For example, the substrate 301 may be doped with a p-type or n-type dopant. In an embodiment, the substrate 301 may be a p-type doped silicon substrate.

Next, an interfacial insulating film 310 may be formed on the substrate 301. The interfacial insulating film 310 may include a silicon oxide (e.g., $SiO_2$), a silicon nitride (e.g., $Si_3N_4$), a silicon oxynitride (e.g., SiON), or an aluminum oxide (e.g., $Al_2O_3$). The interfacial insulating film 310 may be formed using a chemical vapor deposition method, an atomic layer deposition method, or the like. The interfacial insulating film 310 may be formed in an amorphous state. The interfacial insulating film 310 may have a thickness of about 1 nm to about 5 nm.

Then, a ferroelectric material film 320 may be formed on the interfacial insulating film 310. The ferroelectric material film 320 may be formed in an amorphous state. In an embodiment, the ferroelectric material film 320 may include a binary metal oxide. For example, the ferroelectric material film 320 may include a hafnium oxide (e.g., $HfO_2$), a zirconium oxide (e.g., $ZrO_2$), or a combination thereof. The ferroelectric material film 320 may be formed using a chemical vapor deposition method, an atomic layer deposition method, or the like. The ferroelectric material film 320 may have a thickness of about 3 nm to about 15 nm.

In an embodiment, the ferroelectric material film 320 may include at least one dopant. The dopant may be uniformly distributed in the ferroelectric material film 320. For example, when the ferroelectric material film 320 includes a hafnium oxide (e.g., $HfO_2$), a zirconium oxide (e.g., $ZrO_2$), or a combination thereof, the ferroelectric material film 320 may further include a dopant having a valence of 2 to 4. The dopant can function to stably maintain the ferroelectricity of the ferroelectric material film 320 after the ferroelectric material film 320 is crystallized. The dopant may include carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), or a combination thereof. In an embodiment, the dopant may be provided together with a source chemical material of the ferroelectric material film 320 when forming the ferroelectric material film 320. In another embodiment, the dopant may be doped in the ferroelectric material film 320 by an ion implantation method after the formation of the ferroelectric material film 320 is completed. The dopant may be doped in the ferroelectric material film 320 in an amount of about 4 mol % to about 6 mol %.

Subsequently, an electrode film 340 may be formed on the ferroelectric material film 320. The electrode film 340 may include titanium (Ti), tantalum (Ta), tungsten (W), titanium nitride (TiN), tantalum nitride (TaN), tungsten nitride (WN), or a combination thereof. The electrode film 340 may be formed using a physical vapor deposition method, a chemical vapor deposition method, an atomic layer deposition method, or the like.

Referring to FIG. 25, the ferroelectric material film 320 may be heat-treated to form a ferroelectric film 322 including nano-sized grains. In an embodiment, the heat-treatment for the ferroelectric material film 320 may be performed in a state of the electrode film 340 covering the ferroelectric material film 320. The heat-treatment may be performed in a gaseous atmosphere including nitrogen ($N_2$), oxygen ($O_2$), hydrogen ($H_2$), argon (Ar), or a combination thereof. The heat-treatment may be performed at a temperature of about 500° C. to about 1000° C.

Referring to FIG. 26, the electrode film 340, the ferroelectric film 322, and the interfacial insulating film 310 may be patterned. As a result, an interfacial insulating layer 315, a ferroelectric layer 325, and a gate electrode layer 345 sequentially stacked on the substrate 301 may be formed. After that, a dopant may be selectively implanted into regions of the substrate 301 that are exposed as a result of the patterning process. In an embodiment, the dopant implanting process may be performed by an ion implantation ($I^2$) method. As a result, a source region 350 and a drain region 360 may be formed in the exposed regions of the substrate 310 at both ends or on opposite sides of the gate electrode layer 345. By performing the above described processes, the ferroelectric device according to the embodiment of the present disclosure may be manufactured. According to this embodiment, a polarization switching speed of the ferroelectric device can be increased by employing the ferroelectric layer including nano-sized crystal grains. As a result, a write operation speed of the ferroelectric device can be improved.

The embodiments of the inventive concept have been disclosed above for illustrative purposes. Those of ordinary skill in the art will appreciate that various modifications, additions, and substitutions are possible, without departing from the scope and spirit of the inventive concept as disclosed in the accompanying claims.

What is claimed is:

1. A method of manufacturing a ferroelectric device, the method comprising:
   providing a substrate;
   forming a ferroelectric material film over the substrate;
   forming a crystallization seed film over the ferroelectric material film;
   heat-treating the ferroelectric material film with the crystallization seed film to convert the ferroelectric material film into a crystalline ferroelectric film;
   removing the crystallization seed film to expose the crystalline ferroelectric film; and
   forming an electrode film over the crystalline ferroelectric film after removing the crystallization seed film,
   wherein forming the crystallization seed film comprises:
      determining a grain size of the crystallization seed film to be substantially the same as a grain size of the crystalline ferroelectric film after the heat-treating;
      determining a thickness of the crystallization seed film to correspond to the determined grain size of the crystallization seed film; and
      performing a film deposition process to form the crystallization seed film that has the determined grain size and thickness.

2. The method of claim 1, wherein the ferroelectric material film comprises a hafnium oxide, a zirconium oxide, or a combination thereof.

3. The method of claim 2, wherein the ferroelectric material film further comprises a dopant, and the dopant comprises one of carbon (C), silicon (Si), magnesium (Mg), aluminum (Al), yttrium (Y), germanium (Ge), tin (Sn), strontium (Sr), lead (Pb), calcium (Ca), barium (Ba), titanium (Ti), zirconium (Zr), gadolinium (Ga), lanthanum (La), and a combination thereof.

4. The method of claim 1, wherein the crystallization seed film comprises one of silicon (Si), germanium (Ge), silicon germanium (SiGe), silicon carbide (SiC), and a combination thereof.

5. The method of claim 1, wherein the crystallization seed film has a lattice constant that is different from that of the crystalline ferroelectric film.

6. The method of claim 1, wherein the crystallization seed film is formed at a temperature that is lower than a crystallization temperature of the ferroelectric material film.

7. The method of claim 1, wherein the crystallization seed film is formed at a process temperature that is lower than 500° C.

8. The method of claim 1, wherein heat-treating the ferroelectric material film is performed at a process temperature of 500° C. to 1000° C.

9. The method of claim 1, further comprising:

forming an interfacial insulating layer between the substrate and the ferroelectric material film.

10. The method of claim 1, further comprising:

patterning the electrode film and the crystalline ferroelectric film to form a gate electrode layer and a ferroelectric layer over the substrate; and selectively implanting a dopant into regions of the substrate that are exposed on opposite sides of the gate electrode layer with respect to the gate electrode layer, thereby forming a source region and a drain region in the substrate.

* * * * *